United States Patent
Hayakawa et al.

(10) Patent No.: US 7,348,589 B2
(45) Date of Patent: Mar. 25, 2008

(54) LOW POWER CONSUMPTION MAGNETIC MEMORY AND MAGNETIC INFORMATION RECORDING DEVICE

(75) Inventors: Jun Hayakawa, Sendai (JP); Hideo Ohno, Sendai (JP)

(73) Assignees: Hitachi, Ltd., Tokyo (JP); Tohoku University, Miyagi (JP)

( * ) Notice: Subject to any disclaimer, the term of this patent is extended or adjusted under 35 U.S.C. 154(b) by 101 days.

(21) Appl. No.: 11/213,918

(22) Filed: Aug. 30, 2005

(65) Prior Publication Data

US 2006/0067116 A1 Mar. 30, 2006

(30) Foreign Application Priority Data

Sep. 27, 2004 (JP) .............................. 2004-279648

(51) Int. Cl.
*H01L 47/00* (2006.01)

(52) U.S. Cl. ............................... 257/3; 257/9; 257/285; 257/300

(58) Field of Classification Search ............... 257/3, 257/9, 285, 300
See application file for complete search history.

(56) References Cited

U.S. PATENT DOCUMENTS

| 5,695,864 A | 12/1997 | Slonczewski |
| 2002/0105827 A1 | 8/2002 | Redon et al. |
| 2005/0185455 A1* | 8/2005 | Huai ..................... 365/171 |

OTHER PUBLICATIONS

T. Miyazaki et al., "Giant Magnetic Tunneling Effect in $Fe/Al_2O_3/Fe$ Junction", Journal of Magnetism and Magnetic Materials, vol. 139 (1995), pp. L231-L234.

* cited by examiner

*Primary Examiner*—Long Pham
(74) *Attorney, Agent, or Firm*—Reed Smith LLP; Stanley P. Fisher, Esq.; Juan Carlos A. Marquez, Esq.

(57) ABSTRACT

A highly integrated magnetic memory with low power consumption is provided. A first element portion which has a free layer, a first pinned layer formed in the film thickness direction of the free layer, and an insulation barrier layer formed between the free layer and the first pinned layer, and a second element portion which has the aforementioned free layer, a second pinned layer formed in the film surface direction of the free layer, and a non-magnetic layer formed between the free layer and the second pinned layer are provided. A current $I_W$ flows in the film surface direction of the second element portion for writing the magnetic information and a current $I_R$ flows in the film thickness direction of the first element portion for reading the magnetic information.

7 Claims, 7 Drawing Sheets

(Prior art)

US 7,348,589 B2

LOW POWER CONSUMPTION MAGNETIC MEMORY AND MAGNETIC INFORMATION RECORDING DEVICE

CLAIM OF PRIORITY

The present application claims priority from Japanese application JP 2004-279648 filed on Sep. 27, 2004, the content of which is hereby incorporated by reference into this application.

FIELD OF THE INVENTION

The present invention relates to a low power consumption and high output magnetic memory and magnetic information recording device which has both a switching function and a spin torque magnetization reversal function.

BACKGROUND OF THE INVENTION

A magnetic memory of the prior art consists of a memory cell 1 in which a tunneling magnetoresistive element (TMR element) is formed on a MOSFET, as shown in FIG. 13. The TMR element of the memory cell 1 ((T. Miyazaki and N. Tezuka, J. Magn. Magn. Mater. 139, L231 (1995)) consists of a free layer 31, an insulation barrier layer 32, and a pinned layer 33, and is connected to a bit line 212 and an electrode circuit 46. The electrode circuit 46 is connected to the source electrode 22 of MOSFETs 12 to 14 through the electrodes 42 to 45, and the drain electrode 21 is connected to the word line 211 through the electrode 41. Switching is a means, using a MOSFET, in which the magnetization direction of the free layer 31 of the TMR element is rotated by using a current-induced space magnetic field which is generated by passing a current between the bit line 212 and the word line 211 to write the information, and the information is read by the output voltage of the TMR element. Moreover, except for the magnetization rotation using the above-mentioned current-induced space magnetic field, there is a so-called spin transfer torque magnetization reversal method in which the magnetization of the free layer is rotated by passing a current directly through the magnetoresistive element, and they are disclosed, for instance, in U.S. Pat. No. 5,695,864 and JP-A No. 305337/2002.

SUMMARY OF THE INVENTION

In order to achieve low power consumption in a magnetic memory, developing the above-mentioned spin transfer torque magnetization reversal method is one of the important subjects. However, the conventional spin torque magnetization reversal method was one where a current flows in a three-layer structure film, in which a ferromagnetic layer, a non-magnetic layer, and a ferromagnetic layer were stacked in order, in a direction perpendicular to the film surface (along the stacking direction). In this case, a model was proposed by J. Z. Slonzewski in which magnetization was rotated in the direction of current flow and the current ($I_c$: threshold current) which is required for the magnetization reversal is proportional to the demagnetizing field of the recording magnetic layer. The ferromagnetic layer which performs magnetization reversal was a thin film and the influence of the demagnetizing field in the direction perpendicular to the film surface was great, so that a problem arose in that it was impossible to drastically reduce the current which was necessary to perform the magnetization reversal.

It is an objective of the present invention to provide a low power consumption magnetic memory cell in which the current required for the spin transfer torque magnetization reversal is greatly reduced.

According to the present invention, $I_c$ of the spin transfer torque magnetization is drastically reduced by separately forming a stacked film of a ferromagnetic layer, a non-magnetic layer, and a ferromagnetic layer in a film surface and reducing the demagnetizing field of the recording magnetic layer, resulting in the above-mentioned objective being achieved.

A magnetic memory of the present invention comprises a first element portion which has a free layer, a first pinned layer formed in the film thickness direction of the free layer, and an insulation barrier formed between the free layer and the first pinned layer, a second element portion which has the aforementioned free layer, a second pinned layer formed in the film surface direction of the free layer, and a non-magnetic layer formed between the free layer and the second pinned layer, a means for flowing a current $I_R$ in a film thickness direction of the first element portion, and a means for flowing a current $I_W$ in a film surface direction of the second element portion. The current $I_W$ in the film surface direction is used for writing the magnetic information and the current $I_R$ in the film thickness direction is used for reading the magnetic information.

A magnetic memory of the present invention comprises a writing method using a spin torque magnetization in the film surface which does not use a magnetic field induced by a current and a reading method using a TMR element, and can reduce the threshold current for the spin torque magnetization by decreasing the demagnetizing field, resulting in a high output magnetic memory with extremely low power consumption being achieved.

DETAILED DESCRIPTION OF THE PREFERRED EMBODIMENTS

Hereafter, the preferred embodiments of the present invention will be explained with reference to the drawings. The same code is affixed to the same component part, and redundant explanations are omitted in the following figures.

First Embodiment

Figure 1:
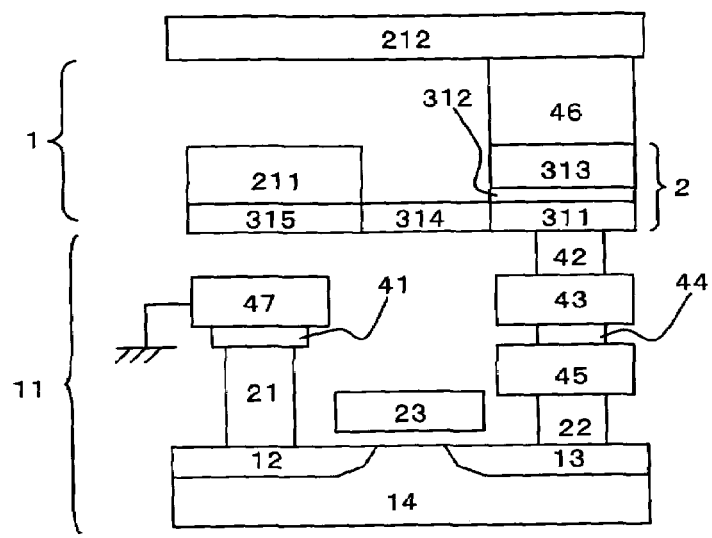
FIG. 1 is a cross-sectional schematic drawing illustrating an embodiment of a magnetic memory cell of the present invention.
Figure 13:
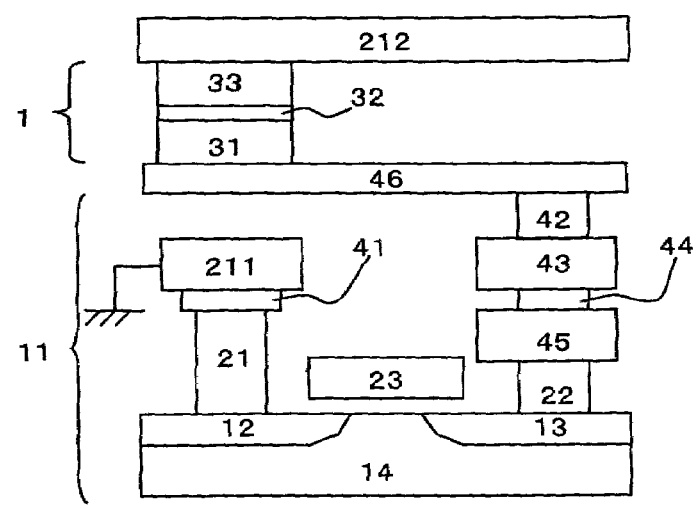
FIG. 13 is a drawing illustrating a conventional structure of a magnetic memory cell.

FIG. 1 is a cross-sectional schematic drawing illustrating an example of a configuration of a magnetic memory and a switching portion of a memory cell. A C-MOS transistor 11 consists of two n-type semiconductors 12 and 13 and a p-type semiconductor 14. The electrode 21 to be a drain is electrically connected to the n-type semiconductor 12 and connected to the ground through the electrode 41 and the electrode 47. The electrode 22 to be a source is connected to the n-type semiconductor 13. Moreover, 23 is a gate electrode, and on/off operation of the current flowing between the source electrode 22 and the drain electrode 21 is controlled by on/off operation of this gate electrode 23. The electrode 45, electrode 44, electrode 43, and electrode 42 are stacked on the source electrode 22, and the free layer 311 is connected to the electrode 42. The tunneling magnetoresistive element (TMR element) of the memory cell 1 consists of a stacked layer of the free layer 311, the insulation barrier layer 312, and the first pinned layer 313. The non-magnetic conduction layer 314 and the second pinned layer 315 are connected to this free layer 311 in the film surface. The word line 211 is connected on the pinned layer 315 to flow a current from the second pinned layer 315 to the free layer 311, which is different from a conventional magnetic memory where a word line is connected to a drain electrode of a MOSFET (refer to FIG. 13).

In this embodiment, the free layer 311 is composed of CoFe (2 nm), the insulation barrier layer 312 of Al oxide film (2 nm), and the first pinned layer 313 of CoFe (5 nm). The non-magnetic conduction layer 314 is composed of Cu (2 nm), and the second pinned layer 315 is composed of CoFe (2 nm). The composition of CoFe is controlled to have a Co content between 50 and 90%. The area of the free layer 311 is controlled to be 50 nm×150 nm, the area of the non-magnetic conduction layer 314 100 nm×150 nm, and the area of the second pinned layer 315 100 nm×150 nm. The product of the magnetic moment and volume of the free layer 311 is $2.7 \times 10^4$ (T·nm³) and it is smaller than $5.4 \times 10^4$ (T·nm³) which is the product of the magnetic moment and volume of the second pinned layer 315, so that the magnetization of the free layer 311 is rotated by a spin transfer torque. The shape of the above-mentioned element is formed by using typical lithography and an electron beam lithography system, RIE (reactive ion etching), and ion milling.

Hf, Ta, Mg, and Ti oxides, except for Al oxide, may be used for the insulation barrier layer 312. Moreover, a CoFe/Ru/CoFe multi-layered film may be used for the first pinned layer 313 and the second pinned layer 315. Since the magnetization direction can be fixed by a strong magnetic field using this multi-layered film, it is possible to reverse the spin torque magnetization reversal efficiently and stably. Au, Cr, Ag, Ru, Al, and Pt, except for Cu, may be used for the non-magnetic conduction layer, and a material including at least one selected from these materials may be used. The bit line 212 is formed on the TMR element 2 through the electrode 46 and is used for a circuit which flows a current while reading the magnetic information written in the free layer 311 of the TMR element.

Figure 2:
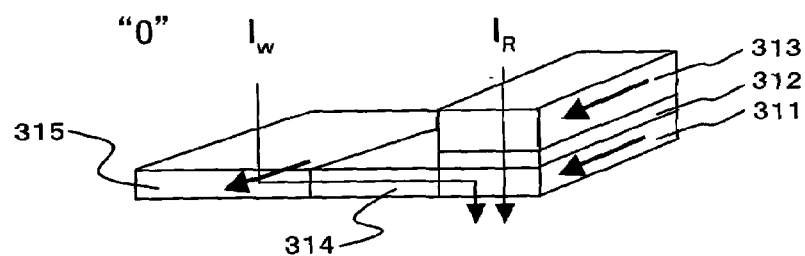
FIGS. 2A and 2B are drawings explaining a method of reading/writing information.
Figure 2:
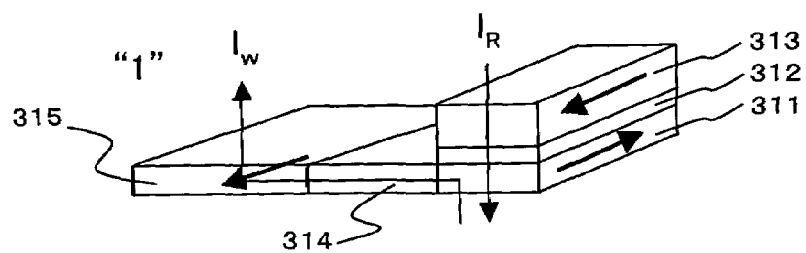

FIG. 2 shows an example illustrating a method for reading/writing magnetic information to the free layer 311. For instance, when the magnetization directions of the free layer 311 and the first pinned layer 313 are assumed to be parallel and information is written as a "0", a write current $I_w$ flows from the second pinned layer 315 to the free layer 311 through the non-magnetic layer 314, as shown in FIG. 2A. On the other hand, when the magnetization directions of the free layer 311 and the first pinned layer 313 are assumed to be opposite and information is written as a "1", a write current $I_w$ flows from the free layer 311 side to the second pinned layer 315 through the non-magnetic layer 314, as shown in FIG. 2B.

Figure 3:
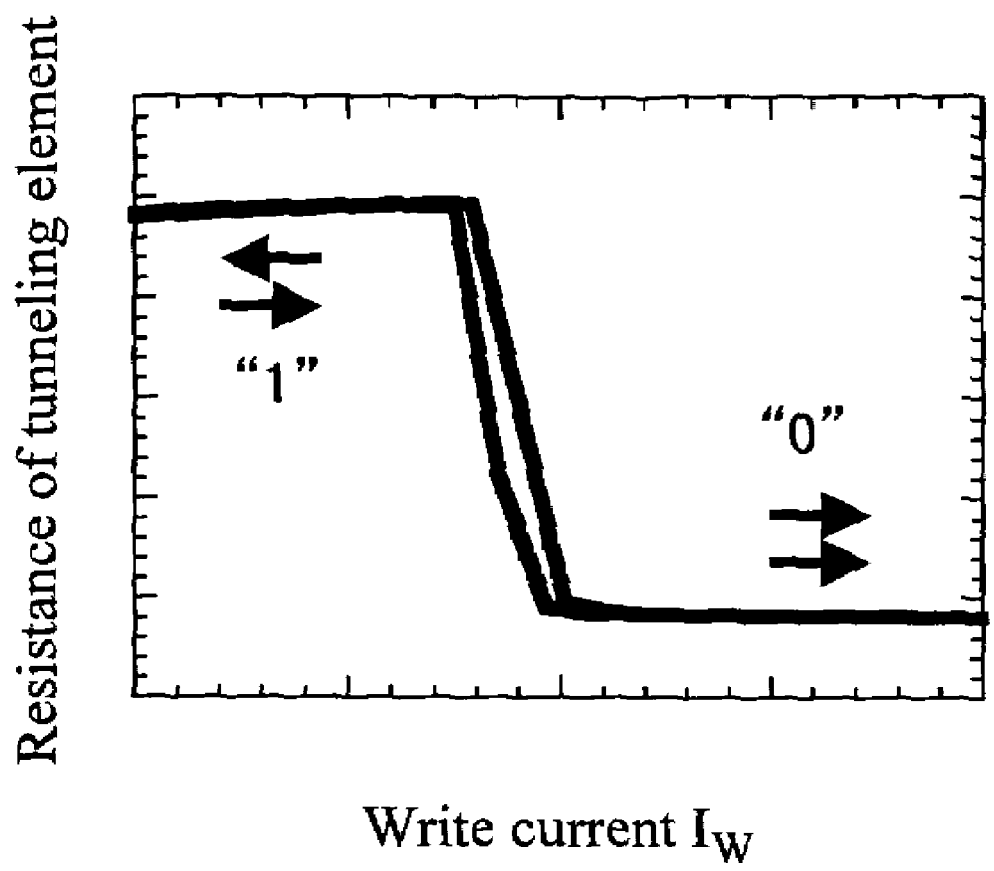
FIG. 3 shows a result where the resistance of a TMR element is read against the write current $I_w$ of a magnetic memory cell of the present invention.

Since the relationship between the write current $I_w$ and the resistance of the TMR element 2 is of a manner as shown in FIG. 3, the low resistance state is the electrical signal "0" in which the magnetizations of the free layer 311 and the second pinned layer 313 are in a parallel arrangement, and the high resistance state is the electrical signal "1" in which the magnetizations of the free layer 311 and the second pinned layer 313 are in an anti-parallel arrangement. A read current $I_R$ flows to the TMR element 2 to read the recorded information. Then, the information can be read as an electrical signal which is caused by the difference of the resistances of the TMR element in the "0" state and the "1" state.

Here, it is know that the threshold current density of the flux reversal caused by a spin torque magnetization method is shown as follows.

$$J_C \propto MV(H_{an}+H_d) \tag{1}$$

M is the saturation magnetization of a magnetic material which performs magnetization reversal, V the volume of the magnetic material, $H_{an}$ the anisotropic magnetic field of the magnetic material, $H_d$ the demagnetizing field of the magnetic film in the direction in which a current flows.

Figure 4:
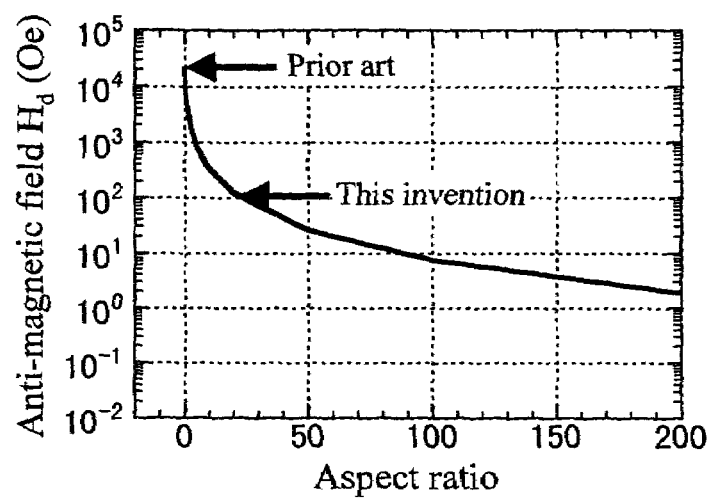
FIG. 4 is a plot showing the relationship between the aspect ratio of a write cell and the demagnetization field of a recording layer.
Figure 5:
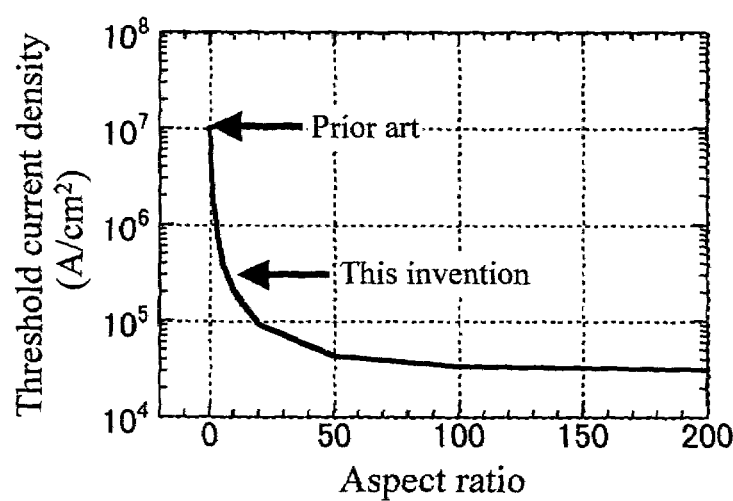
FIG. 5 is a plot showing the relationship between the aspect ratio of a write cell and the threshold current density.

Therefore, it is understood that $J_C$ is proportional to $H_{an}+H_d$. $H_{an}$ of CoFe is on the level of several tens of Oersteds. Regarding $H_d$, for instance, FIG. 4 shows a plot of the cell aspect ratio (diameter/film thickness) of a magnetization-reversing CoFe film and the magnitude of the demagnetizing field $H_d$. In a conventional method in which a current flows in a direction perpendicular to the film surface, the demagnetization field $H_d$ is greater than 10000 Oe. However, since the aspect ratio of the recording layer of this embodiment is 20 in the longitudinal direction in which the current flows, the demagnetizing field can be reduced to about 1/100th compared with the conventional method. That is, great energy was required in the conventional spin torque flux reversal because the spin torque works in a mode which lets the magnetization rotate in the direction perpendicular to the film surface. However, in a method of the present invention, great energy such as that required in the film surface perpendicular method is not required because the spin torque works in a mode which lets the magnetization rotate in the film surface. As a result, according to the present invention, it is possible to reduce the threshold current density to about 1/100th compared with the conventional method as shown in FIG. 5.

Second Embodiment

Figure 6:
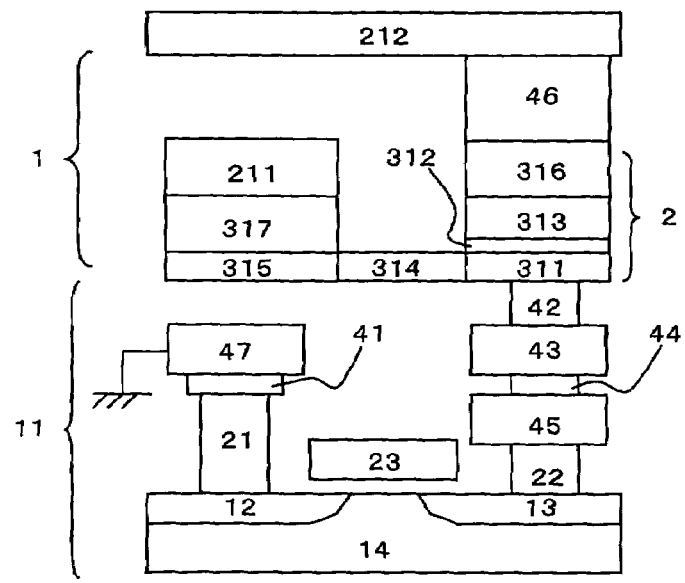
FIG. 6 is a cross-sectional schematic drawing illustrating another example of a configuration of a magnetic memory cell of the present invention.

FIG. 6 is a cross-sectional schematic drawing illustrating another example of a memory cell and a switching portion of a magnetic memory of the present invention. This embodiment corresponds to one in which the first anti-ferromagnetic layer 316 and the second anti-ferromagnetic layer 317 are stacked to fix the magnetization directions of the first pinned layer 313 and the second pinned layer 315, respectively, in one direction in the configuration of the memory cell 1 shown in FIG. 1.

In this embodiment, PtMn (12 nm) was used for the first anti-ferromagnetic layer 316 and the second anti-ferromagnetic layer 317. Herein, except for PtMn, FeMn and IrMn may be used for the anti-ferromagnetic layer. In this embodiment, since the magnetic domains of the pinned layer are controlled to be oriented in one direction due to the anti-ferromagnetic layer, parallel and anti-parallel states of the relative angle of the magnetization direction with the free layer can be achieved stably. Additionally, an increase in the output of the read signal obtained at the TMR element 2 and writing by using the stable spin torque magnetization can be achieved.

Figure 7:
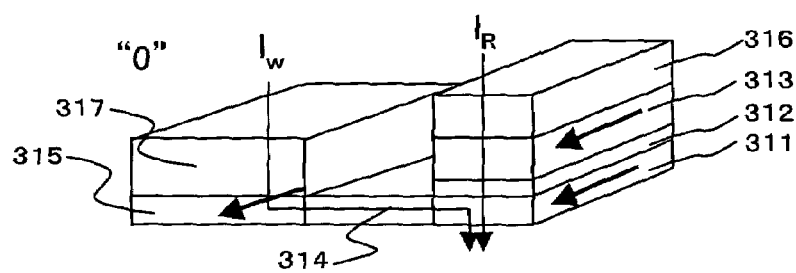
FIGS. 7A and 7B are drawings explaining a method of reading/writing information.
Figure 7:
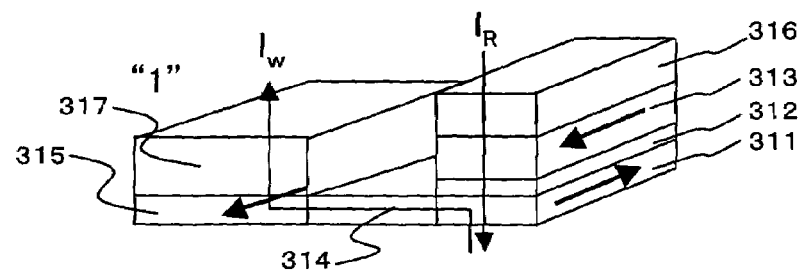

FIG. 7 shows an example illustrating a method of reading/writing magnetic information to the free layer 311. The method of reading/writing magnetic information is the same as that of the first embodiment. When the magnetization direction of the free layer 311 of the TMR element 2 is made parallel to the magnetization direction of the first pinned layer 313, a write current $I_w$ flows from the second pinned layer 315 to the free layer 311 through the non-magnetic layer 314 as shown in FIG. 7A. On the other hand, when the magnetization direction of the free layer 311 is made anti-parallel to the magnetization direction of the first pinned layer 313, a write current $I_w$ flows from the free layer 311 side to the second pinned layer 315 through the non-magnetic layer 314 as shown in FIG. 7B. A read current $I_R$ flows to the TMR element 2 to read the recorded information.

Third Embodiment

Figure 8:
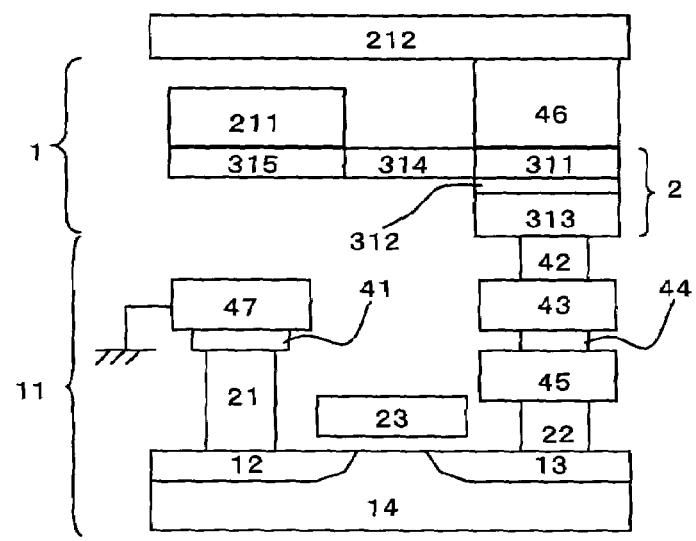
FIG. 8 is a cross-sectional schematic drawing illustrating another example of a configuration of a magnetic memory cell of the present invention.

FIG. 8 is a cross-sectional schematic drawing illustrating another example of a memory cell and a switching portion of a magnetic memory of the present invention. This embodiment shows an example of the configuration, in which the first pinned layer 313 is formed on the transistor 11 side through the insulation barrier layer 312, in the configuration of the memory cell 1 shown in FIG. 1. A magnetic memory of this embodiment can be deposited without breaking the vacuum atmosphere in a manufacturing process of the magnetic memory portion and a high quality TMR element can be fabricated, so that the output of the read signal can be increased.

Figure 9:
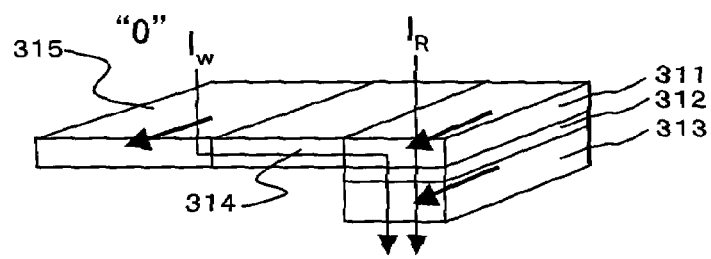
FIGS. 9A and 9B are drawings explaining a method of reading/writing information.
Figure 9:
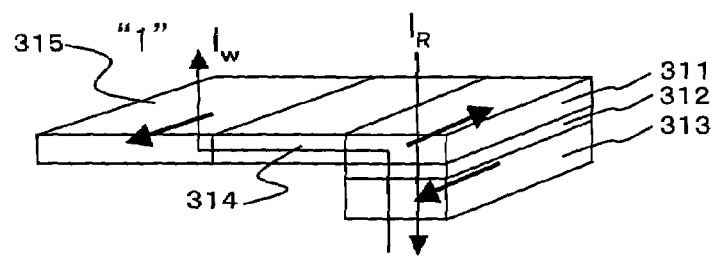

FIG. 9 shows an example illustrating a method of reading/writing magnetic information to the free layer 311. The method of reading/writing magnetic information is same as that of the first embodiment. When the magnetization direction of the free layer 311 of the TMR element 2 is made parallel to the magnetization direction of the first pinned layer 313, a write current $I_w$ flows from the second pinned layer 315 to the free layer 311 through the non-magnetic layer 314 as shown in FIG. 9A. On the other hand, when the magnetization direction of the free layer 311 is made anti-parallel to the magnetization direction of the first pinned layer 313, a write current $I_w$ flows from the free layer 311 side to the second pinned layer 315 through the non-magnetic layer 314 as shown in FIG. 9B. A read current $I_R$ flows to the TMR element 2 to read the recorded information.

Fourth Embodiment

Figure 10:
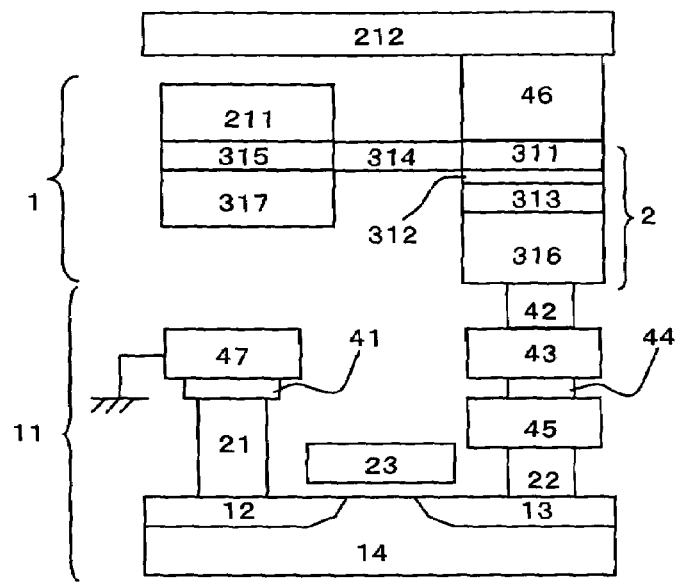
FIG. 10 is a cross-sectional schematic drawing illustrating another example a configuration of a magnetic memory cell of the present invention.

FIG. 10 is a cross-sectional schematic drawing illustrating another example of a memory cell of a magnetic memory and a switching portion of the present invention. This embodiment shows an example of a configuration in which the first anti-ferromagnetic layer 316 and the second anti-ferromagnetic layer 317 are stacked next to each other to fix the magnetization directions of the first pinned layer 313 and the second pinned layer 315, respectively, in one direction in the configuration of the memory 1 shown in FIG. 8. In this embodiment, since the magnetic domains of the pinned layer are controlled to be oriented in one direction due to the anti-ferromagnetic layer, parallel and anti-parallel states of the relative angle of the magnetization direction with the free layer can be achieved stably. Additionally, an increase in the output of the read signal obtained at the TMR element 2 and writing by using the stable spin torque magnetization reversal can be achieved.

Figure 11:
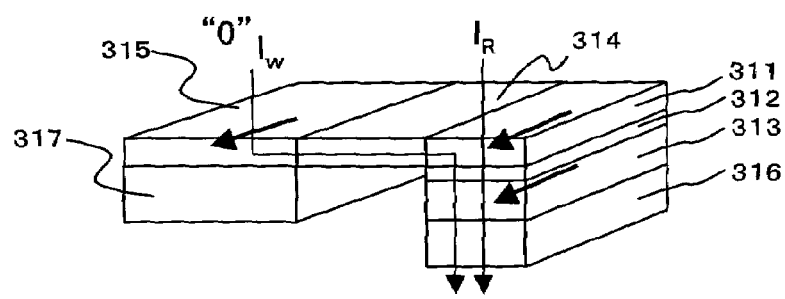
FIGS. 11A and 11B are drawings explaining a method of reading/writing information.
Figure 11:
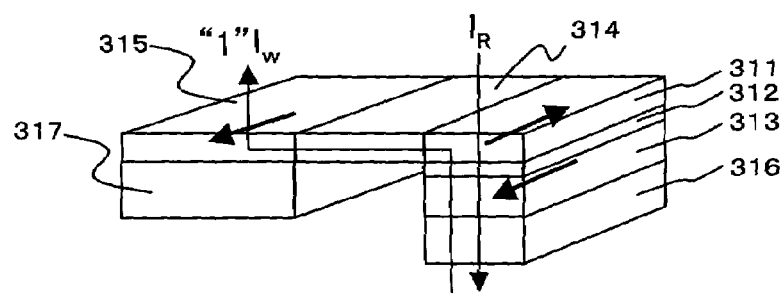

FIG. 11 shows an example illustrating a method of reading/writing magnetic information to the free layer 311. The method of reading/writing magnetic information is the same as that of the first embodiment. When the magnetization direction of the free layer 311 of the TMR element 2 is made parallel to the magnetization direction of the first pinned layer 313, a write current $I_w$ flows from the second pinned layer 315 to the free layer 311 through the non-magnetic layer 314 as shown in FIG. 11A. On the other hand, when the magnetization direction of the free layer 311 is made anti-parallel to the magnetization direction of the pinned layer 313, a write current $I_w$ flows from the free layer 311 side to the second pinned layer 315 through the non-magnetic layer 314 as shown in FIG. 11B. A read current $I_R$ flows to the TMR element 2 to read the recorded information.

Figure 12:
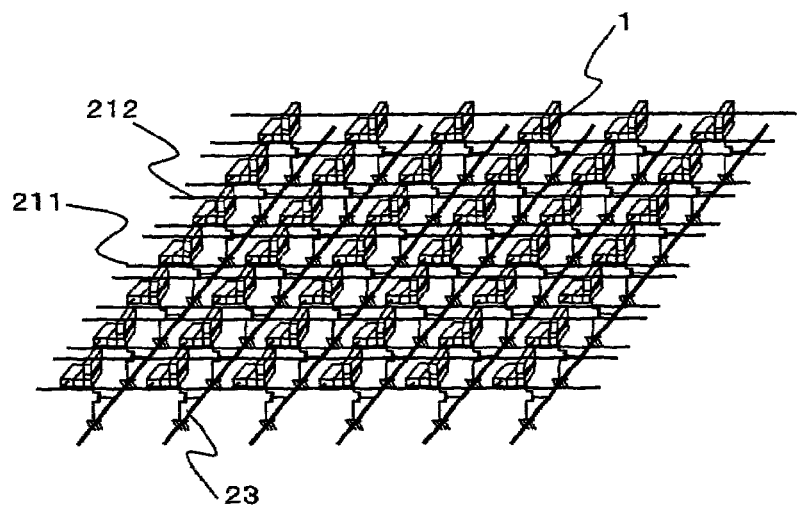
FIG. 12 is an example of a magnetic random access memory in which a memory cell of the present invention is provided.

FIG. 12 is an example of a magnetic random access memory in which the above-mentioned memory cell 1 is provided. The write word line 211 and the bit line 212 are electrically connected to the memory cell 1. The magnetic memory could be operated with low power consumption by providing the magnetic memory cell described in the above-mentioned embodiments.

What is claimed is:

1. A magnetic memory comprising:
    a first element portion which has a free layer, a first pinned layer formed in a film thickness direction of said free layer, and an insulation barrier layer formed between said free layer and first pinned layer;
    a second element portion which has said free layer, a second pinned layer formed in a film surface direction of said free layer, and a non-magnetic layer formed between said free layer and second pinned layer;
    means for flowing a current $I_R$ in a film thickness direction of said first element portion; and
    means for flowing a current $I_w$ in a film surface direction of said second element portion;
    wherein magnetization information is written by flux-reversing the magnetization of said free layer due to said current $I_w$ and the magnetization direction of said free layer is detected by the current $I_R$.

2. A magnetic memory according to claim 1,
    wherein a first electrode and a second electrode formed sandwiching said first element portion in the film thickness direction and a third electrode to apply a current to said second pinned layer are provided, and wherein a current $I_R$ is applied between said first electrode and second electrode, and a current $I_w$ is applied between said third electrode and second electrode.

3. A magnetic memory according to claim 2, wherein said first electrode is connected to said first pinned layer side, and said second electrode is connected to said free layer side.

4. A magnetic memory according to claim 2, wherein a switching element is formed between said free layer and said second electrode.

5. A magnetic memory according to claim 1, wherein a first antiferromagnetic layer to fix the magnetization direction of said first pinned layer by exchange coupling and a second antiferromagnetic layer to fix the magnetization direction of said second pinned layer by exchange coupling are provided.

6. A magnetic memory according to claim 5, wherein an electrode to flow said current $I_w$ is formed on said antiferromagnetic layer and said current $I_w$ flows without passing said insulation barrier layer, said first pinned layer, and said first antiferromagnetic layer.

7. A magnetic memory according to claim 1, wherein the product of the magnetic moment and the volume of said second pinned layer are greater than the product of the magnetic moment and the volume of said free layer.

* * * * *